(12) United States Patent
Takaramoto et al.

(10) Patent No.: US 6,646,860 B2
(45) Date of Patent: Nov. 11, 2003

(54) CAPACITOR AND METHOD FOR FABRICATING THE SAME

(75) Inventors: Toshiharu Takaramoto, Kawasaki (JP); Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/102,798

(22) Filed: Mar. 22, 2002

(65) Prior Publication Data

US 2003/0081371 A1 May 1, 2003

(30) Foreign Application Priority Data

Oct. 30, 2001 (JP) ........................................ 2001-332371

(51) Int. Cl.⁷ ............................................. H01G 4/228
(52) U.S. Cl. ................. 361/306.3; 361/306.1; 361/311; 361/313; 361/321.5
(58) Field of Search ........................... 361/360.1, 306.2, 361/306.3, 311, 321.4, 321.5, 308.3, 301.1, 313, 303, 320; 257/296, 297, 298; 438/396–400

(56) References Cited

U.S. PATENT DOCUMENTS 5,330,931 A * 7/1994 Emesh et al.
5,633,781 A * 5/1997 Saenger et al.
5,814,850 A * 9/1998 Iwasa
5,926,359 A * 7/1999 Creco et al.
6,078,072 A * 6/2000 Okudaira et al.

FOREIGN PATENT DOCUMENTS

JP             03138973 A       6/1991

* cited by examiner

Primary Examiner—Dean A. Reichard
Assistant Examiner—Nguyen T. Ha
(74) Attorney, Agent, or Firm—Armstrong, Westerman & Hattori, LLP

(57) ABSTRACT

The capacitor comprises a lower layer electrode 22 formed on a substrate 10 with an inter-layer insulation film 12 therebetween; an upper layer electrode 24 opposed to the lower layer electrode 22 with an inter-layer insulation film 12 therebetween, a lower interconnection layer 14 formed between the substrate 10 and the lower layer electrode 22, and electrically connected to the upper layer electrode 24, whereby the parasitic capacitance, which is a cause for lower capacitor accuracy, useless power consumption, etc. can be drastically decreased, and external noises can be shielded off.

8 Claims, 14 Drawing Sheets

CAPACITOR AND METHOD FOR FABRICATING THE SAME

BACKGROUND OF THE INVENTION

The present invention relates to a capacitor to be used in analog circuits of semiconductor integrated circuits, and a method for fabricating the capacitor.

In semiconductor integrated circuits (ICs), capacitors have been so far generally used to cut direct current components in high-frequency regions. The capacitors have been required to be built in ICs for the purpose of cost reduction by external parts decrease, terminal number decrease, etc. The capacitors have been required to be built in ICs for easy countermeasures to noises.

Conventionally, a capacitor built in an IC is always accompanied by a parasitic capacitance. The parasitic capacitance is an error of an intrinsic capacitance of the capacitor which causes accuracy reduction. Although the capacitor itself consumes no electric power, a parasitic capacitance part consumes useless electric power. Accordingly, a large parasitic capacitance requires the higher driving capacity for the driving amplifier of the IC. A result is an undesirable chain of a higher power consumption. Thus, the parasitic capacitance of capacitors built in ICs have been a barrier to high-speed achievements of the ICs.

For the end of decreasing such parasitic capacitance, process developments have been made to replace MOS (Metal-Oxide-Semiconductor) capacitors by two-layer poly capacitors, MIM (Metal-Insulator-Metal) capacitors, etc. which will be described later. Contrivances for reducing the influence of the parasitic capacitance to the circuits have been made in circuits and layouts.

FIGS. 13A and 13B are diagrammatic views of conventional capacitors, which show the structure thereof. FIG. 13A is a sectional view of 2-layer poly capacitor, which shows the structure thereof. FIG. 13B is a sectional view of an MIM capacitor, which shows the structure thereof.

As shown in FIG. 13A, the 2-layer poly capacitor comprises a lower layer electrode 104 and an upper layer electrode 106 of a polycrystal silicon film formed in an inter-layer insulation film 102 on a silicon substrate 100. As shown in FIG. 13B, the MIM capacitor comprises a lower layer electrode 108 and an upper layer electrode 110 of a metal, such as aluminium, copper, titanium nitride or others, formed in an inter-layer insulation film on a silicon substrate 100. Recently, the MIM capacitor, which is superior in the parasitic capacitance and parasitic resistance, is becoming dominant.

In a capacitor built in an IC, the parasitic capacitance tends to combine with the lower electrode, which is thought to be caused by its structural reason. Accordingly, when the capacitor is built in the IC, the lower layer electrode is formed on the side where the circuit is less vulnerable to the parasitic capacitance. That is, the lower layer electrode is used on the side where a potential is fixed. The upper layer electrode is used generally on the side where the circuit is vulnerable to the parasitic capacitance.

An example of the application of the conventional MIM capacitor to an IC will be explained by means of a case that the conventional MIM capacitor is applied to a sample and hold circuit with reference to FIGS. 14A and 14B. FIG. 14A is a sectional view of the MIM capacitor used in the sample and hold circuit. FIG. 14B is an upper side view of the MIM capacitor, which shows the structure thereof. The sectional view shown in FIG. 14A is along the line A–A' in FIG. 14B. The capacitor shown in FIGS. 14A and 14B includes a plurality of inter-layer insulation films formed between interconnection layers, etc., but the inter-layer insulation films will be referred to an inter-layer insulation film 124 as a whole in the explanation with reference to FIGS. 14A and 14B.

As shown in FIG. 14A, in the sample and hold circuit, an input unit 112 for an input voltage to be inputted to, and an output unit 114 for an output voltage to be outputted are interconnected via a switch 116. A node 118 is provided between the switch 116 and the output unit 114 and is connected to a capacitor 120. The side of the capacitor 120 opposed to the node 116 is grounded, and the potential is fixed. The capacitor 120 is provided by an MIM capacitor.

As shown in FIG. 14A, the MIM capacitor comprises a lower layer electrode/lower interconnection layer 126 which functions as a lower layer electrode of the capacitor, formed on a substrate 122 with an inter-layer insulation film 124 formed therebetween. An upper interconnection layer 132 is formed above the upper layer electrode 128, connected to the upper electrode 128 through a via layer 130 formed in the inter-layer insulation film 124.

In the sample and hold circuit, the node 118 has a high impedance for a period of time of an operation when the capacitor 120 has a parasitic capacitance, which makes it easy to superimpose noises via the parasitic capacitance. This is a cause for errors. Then, in a case that an MIM capacitor is used in such sample and hold circuit, as shown in FIG. 14A, the upper interconnection layer 128 is connected to the node 118. The lower electrode/lower interconnection layer 126 is grounded with a potential fixed. The lower electrode of the MIM capacitor, which tends to have parasitic capacities, has a potential fixed, whereby the influence of the parasitic capacitance has been reduced as much as possible.

As described above, in order to reduce or remove parasitic capacities of capacitors built in ICs, the approaches have been made from various viewpoints of process developments, circuit designs, etc.

However, the above-described conventional capacitor has failed sufficiently reduce the parasitic capacitance. There is a demerit that the structure of the conventional MIM capacitor is vulnerable to influences of external noises.

SUMMARY OF THE INVENTION

An object of the present invention is to provide a capacitor which can drastically reduce parasitic capacitance, which is a cause for lower accuracy of the capacitor, useless electric power consumption, etc. in comparison with the conventional capacitor, and can shield off external noises, and a method for fabricating the capacitor.

According to one aspect of the present invention, there is provided a capacitor comprising: a lower layer electrode formed on a substrate with a first insulation film therebetween; an upper layer electrode opposed to the lower layer electrode with a second insulation film therebetween; and a lower interconnection layer formed between the substrate and the lower layer electrode and electrically connected to the upper layer electrode.

According to another aspect of the present invention, there is provided a capacitor comprising: a lower layer electrode formed on a substrate with a first insulation film therebetween; an upper layer electrode opposed to the lower layer electrode with a second insulation film therebetween; a lower interconnection layer formed between the substrate and the lower layer electrode and electrically connected to the upper layer electrode; and an upper interconnection layer formed on the upper layer electrode with a third insulation film therebetween and electrically connected to the lower interconnection layer.

According to farther another aspect of the present invention, there is provided a method for fabricating a capacitor comprising the steps of forming a lower layer electrode on a substrate with a first insulation film therebetween, and forming an upper layer electrode opposed to the lower layer electrode with a second insulation film therebetween, the method further comprising the step of: forming a lower interconnection layer between the substrate and the lower layer electrode and electrically connected to the upper layer electrode.

According to farther another aspect of the present invention, there is provided a method for fabricating a capacitor comprising the steps of: forming a lower layer electrode on a substrate with a first insulation film therebetween; forming an upper layer electrode opposed to the lower layer electrode with a second insulation film therebetween; forming a lower interconnection layer between the substrate and the lower layer electrode and electrically connected to the lower layer electrode; and forming a upper interconnection layer on the upper layer electrode with a third insulation film therebetween, and electrically connected to the lower interconnection layer.

As described above, the capacitor according to the present invention comprises the lower layer electrode formed on the substrate with a first insulation film therebetween, the upper layer electrode opposed to the lower layer electrode with a second insulation film therebetween, and the lower interconnection layer formed between the substrate and the lower layer electrode and electrically connected to the upper layer electrode, whereby the parasitic capacitance, which is a cause for lower capacitor accuracy, useless power consumption, etc. can be drastically decreased, and external noises can be shielded off.

The capacitor according to the present invention comprises the lower layer electrode formed on the substrate with a first insulation film therebetween, the upper layer electrode opposed to the lower layer electrode with a second insulation film therebetween, the lower interconnection layer formed between the substrate and the lower layer electrode and electrically connected to the lower layer electrode, and the upper interconnection layer formed on the upper layer electrode with a third insulation film therebetween and electrically connected to the lower interconnection layer, whereby the parasitic capacitance, which is a cause for lower capacitor accuracy, useless power consumption, etc. can be drastically decreased, and external noises can be shielded off.

DETAILED DESCRIPTION OF THE INVENTION

[A First Embodiment]

Figure 1A:
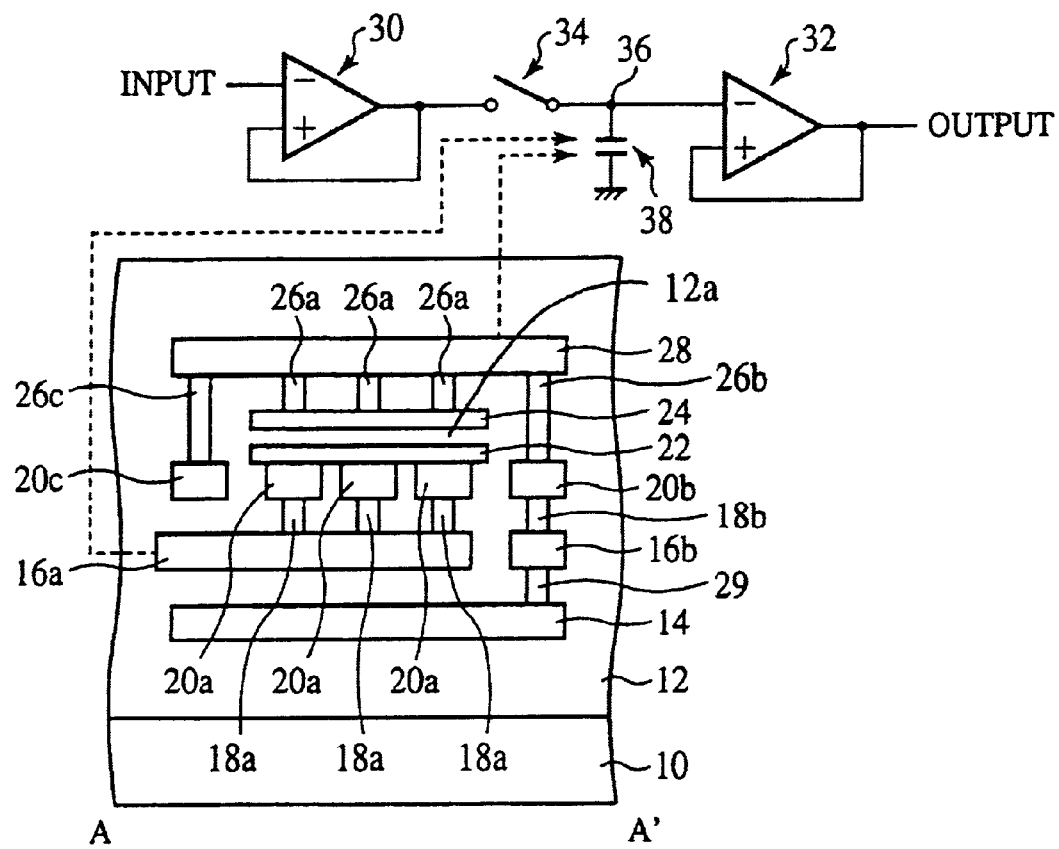
FIGS. 1A and 1B are diagrammatic views of the capacitor according to a first embodiment of the present invention, which show a structure thereof.
Figure 1B:
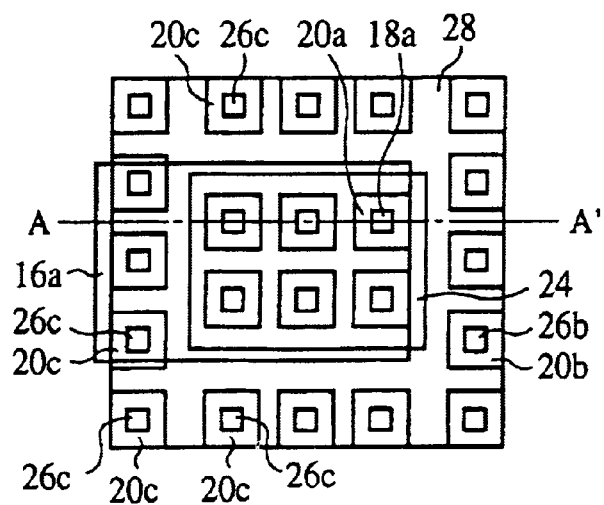

The capacitor according to a first embodiment of the present invention and a method for fabricating the capacitor will be explained with reference to FIGS. 1A, 1B, 2A–2D, 3A–3C, 4A, and 4B. FIGS. 1A and 1B are diagrammatic views of the capacitor according to the present embodiment, which show a structure thereof. FIGS. 2A–2D, 3A–3C, 4A, and 4B are sectional views of the capacitor in the steps of the method for fabricating the capacitor, which show the method.

The capacitor according to the present embodiment will be explained with reference to FIGS. 1A and 1B. FIG. 1A is a sectional view of the capacitor according to the present embodiment, which shows the structure. FIG. 1B is a top view of the capacitor according to the present embodiment, which shows the structure. FIG. 1A shows a case of applying the capacitor according to the present embodiment to a sample and hold circuit. Sample and hold circuits are circuits generally for sampling input voltages of A/D converters, etc. of ICs, etc. and holding the sampled voltages. FIG. 1A is the sectional view along the line A–A' in FIG. 1B. The capacitor according to the present embodiment includes a plurality of inter-layer insulation films formed between interconnection layers, etc., but for the convenience of the explanation, the inter-layer insulation films are referred to as an inter-layer insulation film 12 as a whole.

In the capacitor according to the present embodiment, a lower interconnection layer 14 is formed on a substrate 10 with the inter-layer insulation film formed therebetween. An intermediate interconnection layer 16a is formed on the lower interconnection layer 14 with the inter-layer insulation film 12 therebetween. A lower electrode 22 of the MIM capacitor is formed on the intermediate interconnection layer 16a with the inter-layer insulation film 12 therebetween. The intermediate interconnection layer 16a and the lower electrode 22 are electrically connected to each other through a via layer 18a and a relay interconnection layer 20a.

An upper electrode 24 of the MIM capacitor is formed on the lower electrode 22 with the inter-layer insulation film 12a therebetween. An upper interconnection layer 28 is formed on the upper electrode 24 with the inter-layer insulation film 12 therebetween. The upper electrode 24 and the upper interconnection layer 28 are electrically connected to each other through a via layer 26a.

The upper interconnection layer 28 is electrically connected to the lower interconnection layer 14 through a via layer 29, an intermediate interconnection layer 16b, a via layer 18b, a relay interconnection layer 20b and the via layer 26b. The intermediate interconnection layer 16b and the intermediate interconnection layer 16a are formed of the same layer. The relay interconnection layer 20b and the relay interconnection layer 20b are formed of the same layer.

A relay interconnection layer 20c is formed of the layer forming the relay interconnection layers 20a, 20b. The upper interconnection layer 28 and the relay interconnection layer 20c are connected to each other through a via layer 26c. As shown in FIG. 1B, the via layer 26c and the relay interconnection layer 20c are formed, surrounding the lower electrode 22 and the upper electrode 24 at a plurality of positions.

As shown in FIG. 1A, the sample and hold circuit includes an input unit 30 for input voltages to be inputted to, and an output unit 32 for outputting output voltages, which are connected to each other by a switch 34. A node 36 is disposed between the switch 34 and the output unit 32 and is connected to the capacitor 38. The capacitor 38 has the side opposed to the node 36 grounded with a potential fixed. The capacitor 38 is provided by the capacitor according to the present embodiment having the above-described structure.

That is, in the sample and hold circuit, the intermediate interconnection layer 16a of the capacitor according to the present embodiment is connected to the node 36, and upper interconnection layer 28 electrically connected to the lower interconnection layer 14 is grounded with a potential constantly fixed.

The capacitor according to the present embodiment is characterized by the lower interconnection layer 14 formed between the lower electrode 22 and the substrate 10, the interconnection layers, etc. including the via layer 29, etc. interconnecting the lower interconnection layer 14 and the upper interconnection layer 28, and the via layer 26c formed on a side of the lower electrode 22 and the upper electrode 24. The lower electrode 22 and the upper electrode 24 of the MIM capacitor are covered by the interconnection layers, whereby generation of the parasitic capacitance can be prevented. The interconnection layers, etc. covering the lower electrode 22 and the upper electrode 24 of the MIM capacitor function as a shield and can shield off external noises.

Then, effects of applying the capacitor according to the present embodiment having the above-described structure to the sample and hold circuit will be explained.

In the sample and hold circuit, the switch 34 is turned on for a short period of time to charge the capacitor 38 with an input potential. This period of time is called a sampling period. Then, the switch 34 is turned off, and the voltage charged to the capacitor 38 is held, and the held potential does not change until the next turn-of of the switch 34. This period is called a hold period. During a hold period, the node 36 has a high impedance, and when a parasitic capacitance is present in the capacitor 38, noises tend to be superimposed, which is a cause for errors.

The capacitor according to the present embodiment includes the lower electrode 22 covered by the interconnection layers, etc. as the electrode on the side of the node 36, which is vulnerable to the parasitic capacitance, and the upper electrode 24 located on the side of the fixed potential. The application of the capacitor according to the present embodiment can realize a circuit which is invulnerable to the parasitic capacitance and has higher accuracy.

Next, the method for fabricating the capacitor according to the present embodiment will be explained with reference to FIGS. 2A–2D, 3A–3C, 4A, and 4B.

Figure 2A:
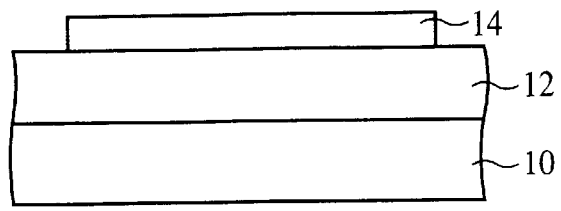
FIGS. 2A–2D are sectional views of the capacitor according to the first embodiment of the present invention in the steps of the method for fabricating the capacitor, which explain the method (Part 1).

First, the inter-layer insulation film 12 is formed on the substrate 10. Next, an aluminium layer, for example, is formed on the inter-layer insulation film 12 and patterned into the lower interconnection layer 14 (FIG. 2A).

Figure 2B:
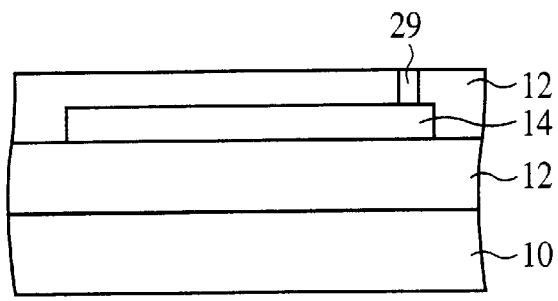

Then, the inter-layer insulation film 12 is formed on the entire surface, and a via hole is formed in the inter-layer insulation film 12 down to the lower interconnection layer 14. Next, a metal film is formed on the entire surface to bury the via hole. The metal film except that buried in the via hole is removed by CMP (Chemical Mechanical Polishing). Thus, the via layer 29 electrically connected to the lower interconnection layer 14 is formed (FIG. 2B).

Figure 2C:
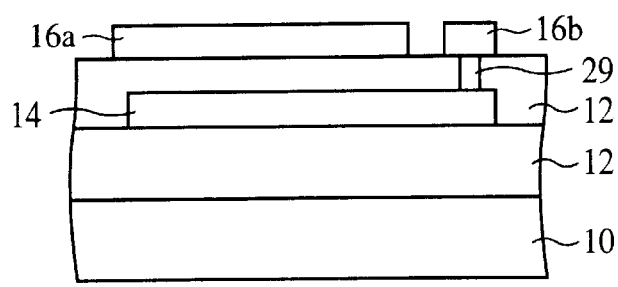

Next, an aluminium film, for example, is formed on the entire surface and patterned into the intermediate interconnection layers 16a, 16b by the usual lithography technique (FIG. 2C).

Figure 2D:
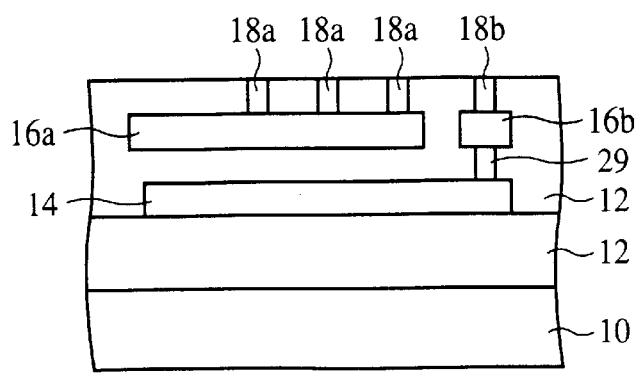

Then, the inter-layer insulation film 12 is formed on the entire surface, and via holes in the inter-layer insulation film 12 down to the intermediate interconnection layer 16a and down to the intermediate interconnection layer 16b. Then, a metal film is formed on the entire surface to bury the metal film in the via holes. The metal film except that buried in the via holes is removed by CMP. Thus, the via layer 18a electrically connected to the intermediate interconnection layer 16a, and the via layer 18b electrically connected to the intermediate interconnection layer 16b can be formed (FIG. 2D).

Figure 3A:
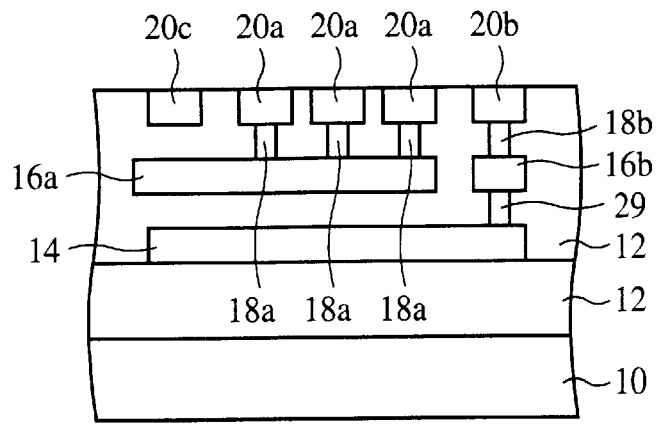
FIGS. 3A–3C are sectional views of the capacitor according to the first embodiment of the present invention in the steps of the method for fabricating the capacitor, which explain the method (Part 2).

Next, the relay interconnection layers 20a, 20b, 20c are formed by damascening, which is applied to copper interconnection process. That is, the inter-layer insulation film 12 is formed on the entire surface, and grooves which reach the via layers 18a, 18b and grooves which reach none of the via layers 18a, 18b are formed in the inter-layer insulation film 12. Next, a copper film, for example, is formed on the entire surface to bury in the copper film in the grooves. Next, the copper film except that buried in the grooves is removed by CMP. Thus, the relay interconnection layer 20a electrically connected to the via holes 18a, the relay interconnection layer 20b electrically connected to the via layer 18b, and the relay interconnection layer 20c electrically connected to none of the relay interconnection layers 20a, 20b (FIG. 3A).

Figure 3B:
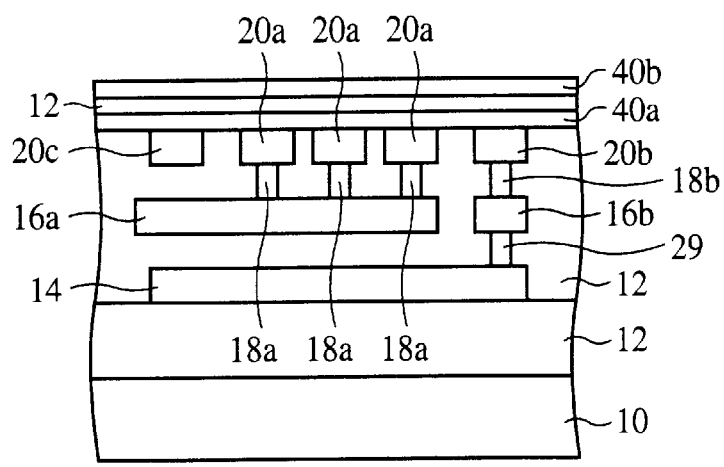

Next, a titanium nitride film 40a, the inter-layer insulation film 12 and the titanium nitride film 40b are formed on the entire surface in the stated order (FIG. 3B).

Figure 3C:
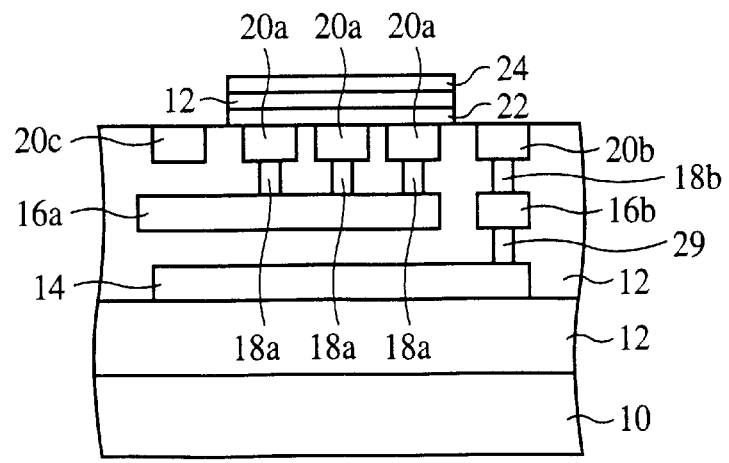

Then, the titanium nitride film 40a, the inter-layer insulation film 12 and the titanium nitride film 40b laid one on another is patterned by the usual lithography technique, to form the lower electrode 22 contacting the relay interconnection layer 20a buried in the grooves, and the upper electrode 24 opposed to the lower electrode 22 with the inter-layer insulation film 12 therebetween (FIG. 3C).

Figure 4A:
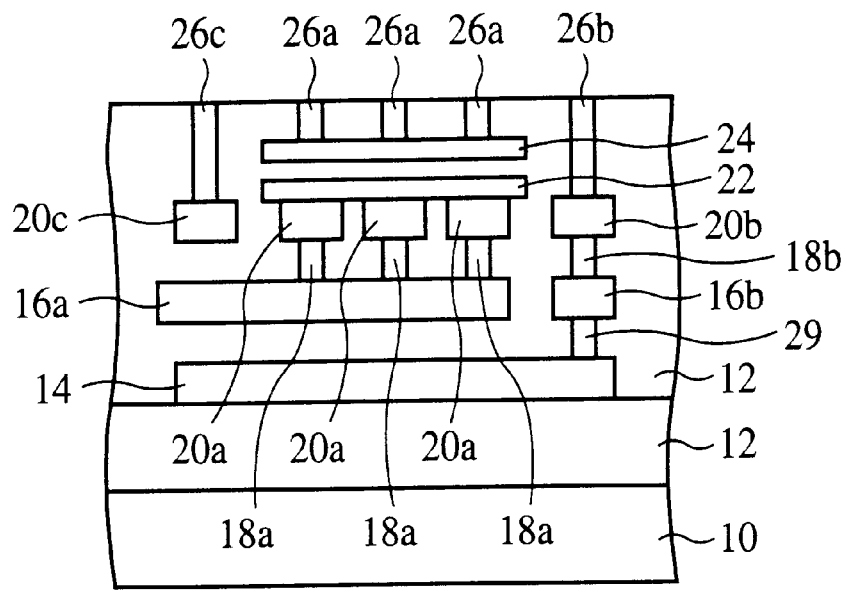
FIGS. 4A and 4B are sectional views of the capacitor according to the first embodiment of the present invention in the steps of the method for fabricating the capacitor, which explain the method (Part 3).

Next, an inter-layer insulation film 12 is formed on the entire surface, and via holes are formed in the inter-layer insulation film 12 down to the upper electrode 24 and down to the relay interconnection layers 20b, 20c. Then, a metal film is formed on the entire surface to bury the metal film in the via holes. Next, the metal film except that buried int he via holes is removed by CMP. Thus, the via layer 26a electrically connected to the upper layer electrode 24, the via layer 26b electrically connected to the relay interconnection layer 20b and the via layer 26c electrically connected to the relay interconnection layer 20c are formed (FIG. 4A).

Figure 4B:
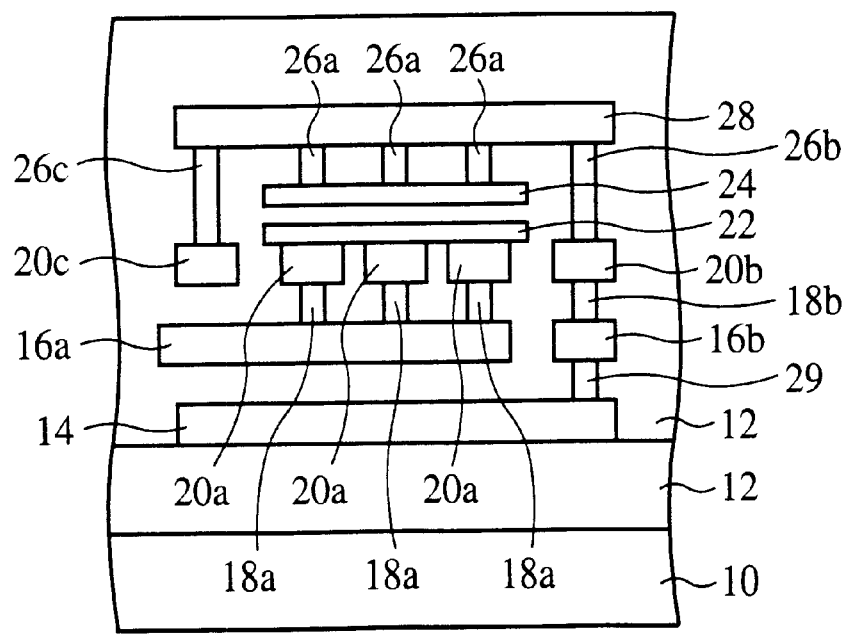

Next, the upper interconnection layer 28 connected to the via layers 26a, 26b, 26c is formed. Then, the inter-layer insulation film 12 is formed on the entire surface. Thus, the fabrication of the capacitor according to the present embodiment is completed (FIG. 4B).

As described above, according to the present embodiment, the lower layer electrode 22 and the upper layer electrode 24 of the MIM capacitor are covered by the interconnection layers, etc. on both upper and lower sides, wherein generation of the parasitic capacitance can be prevented, and external noises can be shielded off.

[A Second Embodiment]

Figure 5:
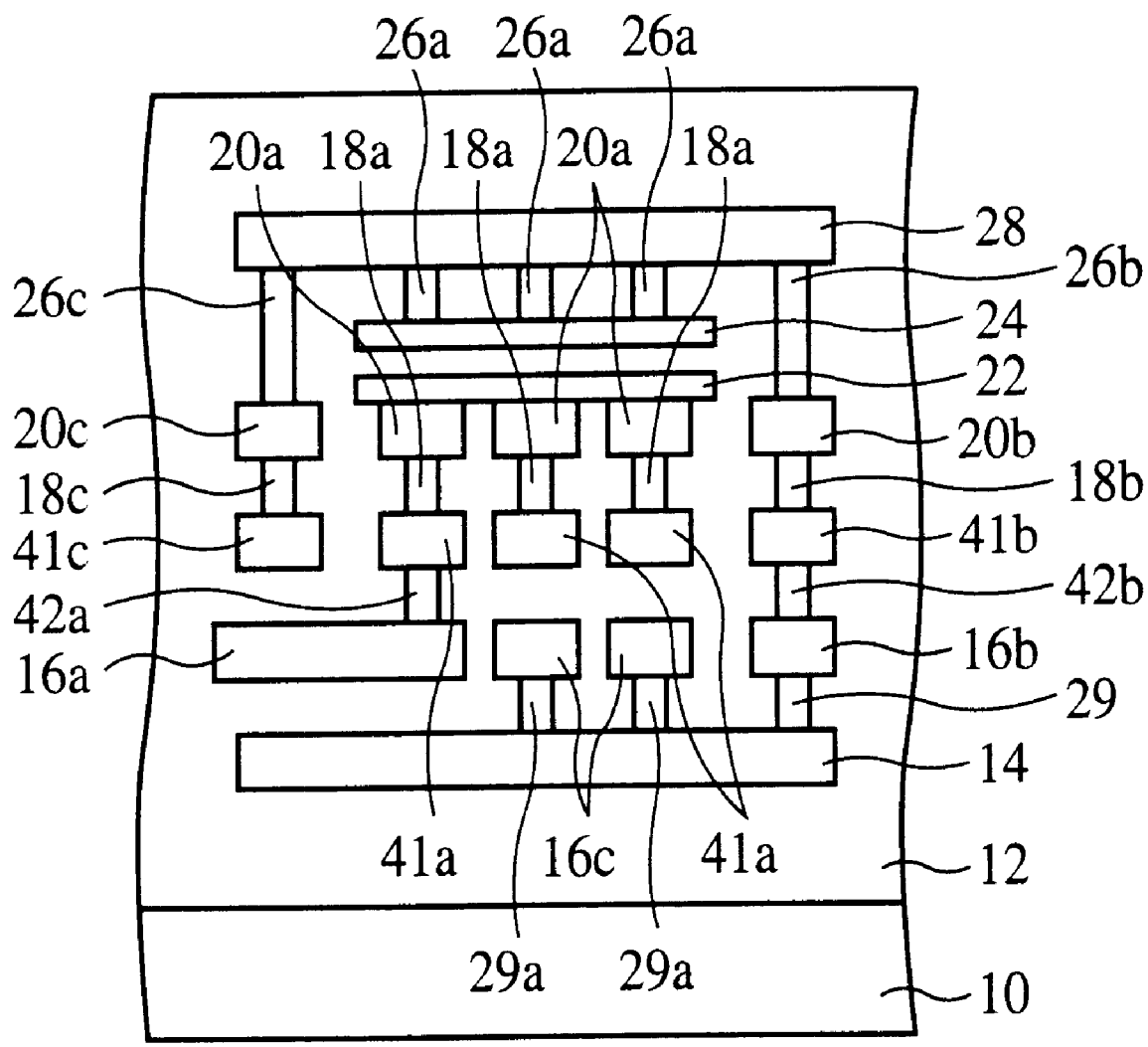
FIG. 5 is a sectional view of the capacitor according to a second embodiment of the present invention, which shows a structure thereof.

The capacitor according to a second embodiment of the present invention and the method for fabricating the capacitor will be explained with reference to FIG. 5. FIG. 5 is a sectional view of the capacitor according to the present embodiment, which shows a structure thereof. The same member of the present embodiment as those of the capacitor according to the first embodiment and the method for fabricating the same are represented by the same reference numbers not to repeat or to simplify their explanation.

The capacitor according to the present embodiment comprises an additional interconnection layer between the relay interconnection layers 20a, 20b, 20c and the intermediate interconnection layers 16a, 16b, whereby an interconnection layer capacitance is provided in an array wiring pattern with respect to the lower layer electrode 22.

That is, relay interconnection layers 20a, 20b, 20c are connected to interconnection layers 41a, 41b, 41c through via layers 18a, 18b, 18c.

An intermediate interconnection layer 16a is connected to one part of the wiring layer 41a through the via layer 42a. The wiring layer 41b is connected to the intermediate interconnection layer 16b through the via layer 42b. The intermediate interconnection layer 16c is connect to the lower interconnection layer 14 through the via layer 29a, opposed to the wiring layer 41a which is not connected to the intermediate interconnection layer 16a. The relay interconnection layer 20a, the wiring layer 41a and the intermediate interconnection layer 16c have substantially the same area. The wiring layer 41a and the intermediate interconnection layer 16c are opposed to each other with the inter-layer insulation film 12 therebetween.

As described above, the capacitor according to the present embodiment is characterized mainly in that the array wiring pattern comprising the relay interconnection layer 20a, the interconnection layer 41a, and the intermediate interconnection layer 16c provides an interconnection layer capacitance. An interconnection layer capacitance in the array interconnection layer pattern is formed between the lower layer electrode 22 of the MIM capacitor and the lower interconnection layer 14. The interconnection layer capacitance is a capacitance of a certain ratio to the MIM capacitor, whereby accuracy decrease of the MIM capacitor can be prevented.

The capacitor according to the present embodiment can be fabricated by adding the step of forming the interconnection layers 41a, 41b, 41c before the step of forming the relay interconnection layers 20a, 20b, 20c. Simultaneously with forming the intermediate interconnection layers 16a, 16b, the intermediate interconnection layer 16c connected to the interconnection layer 14 through the via layer 29a and opposed to the interconnection layer 41a must be formed.

As described above, according to the present embodiment, the lower layer electrode 22 and the upper layer electrode 24 of the MIM capacitor are covered by the interconnection layers, etc. on both upper and lower sides, wherein generation of the parasitic capacitance can be prevented, and external noises can be shielded off. The array interconnection layer capacitance is formed with respect to the lower layer electrode 22, whereby the capacitor of higher accuracy can be realized.

In the present embodiment, two layers of the relay interconnection layer 20a and the interconnection layers 41a form the array interconnection layer pattern. However, not only the interconnection layer 41a but also a plurality of interconnection layers are added to form the array interconnection layer pattern.

In this case, a plurality of additional interconnection layers and via layers among the interconnection layers are may be laid one on another by lithography technique using the same interconnection mask and the same via mask. The array interconnection pattern can be thus simply formed.

A number of combinations of the relay interconnection layer 20a and the interconnection layer 41a, and the opposed intermediate interconnection layer 16c forming the interconnection capacitance is preferably set in proportion with an area of the lower layer electrode, whereby a capacitance can be more accurately computed. Thus, The MIM capacitor can have higher accuracy.

[A Third Embodiment]

Figure 6A:
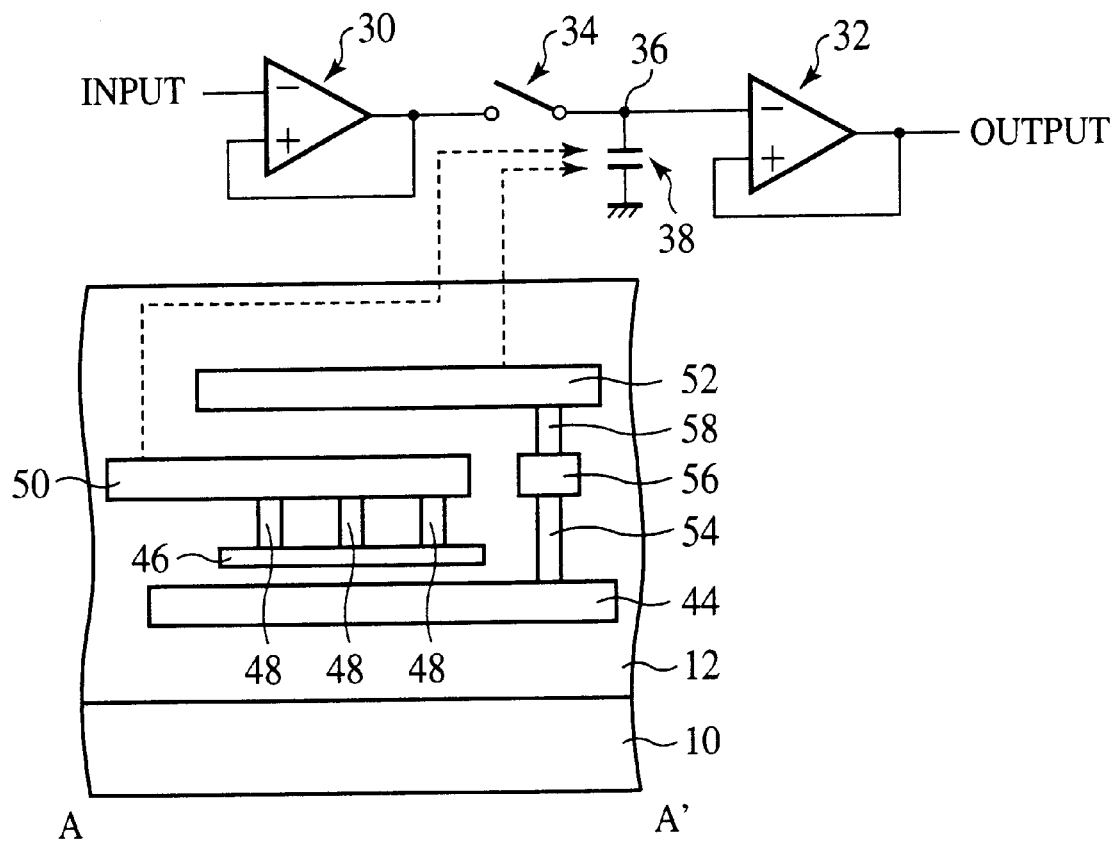
FIGS. 6A and 6B are diagrammatic views of the capacitor according to a third embodiment of the present invention, which show a structure thereof.
Figure 6B:
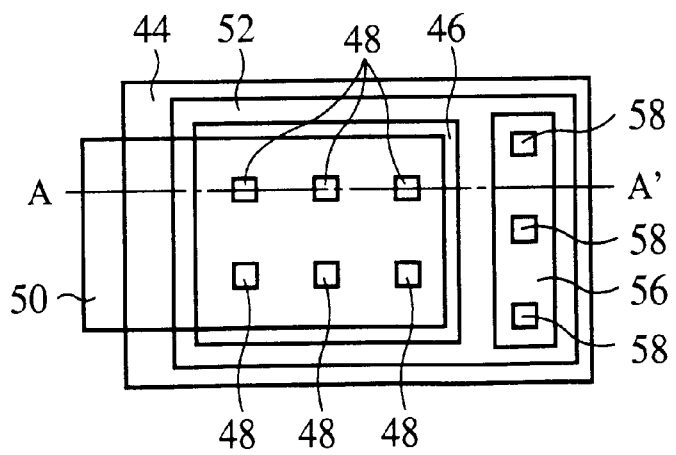

The capacitor according to a third embodiment of the present invention and the method for fabricating the capacitor will be explained with reference to FIGS. 6A, 6B, 7A–7D, 8A–8C, and 9A–9C. FIGS. 6A and 6B are diagrammatic views of the capacitor according to the present embodiment, which show a structure thereof. FIGS. 7A–7D, 8A–8C, and 9A–9C are sectional views of the capacitor according to the present embodiment in the steps of the method for fabricating the capacitor, which show the method. The same members of the present embodiment as those of the capacitor according to the first embodiment and the method for fabricating the same are represented by, the same reference numbers not to repeat or to simplify their explanation.

The capacitor according to the present embodiment will be explained with reference to FIGS. 6A and 6B. FIG. 6A is a sectional view of the capacitor according to the present embodiment. FIG. 6B is a top view of the capacitor according to the present embodiment, which show the structure thereof. FIG. 6A shows a case of applying the capacitor according to the present embodiment to a sample and hold circuit. FIG. 6A is the sectional view along the line A–A' in FIG. 6B.

In the capacitor according to the present embodiment, a lower layer electrode/lower interconnection layer 44 which functions as the lower layer electrode of an MIM capacitor is formed on a substrate 10 with an inter-layer insulation film 12 therebetween. An upper layer electrode 46 of the MIM capacitor is formed on the lower layer electrode/lower interconnection layer 44 with the inter-layer insulation film 12 therebetween. An intermediate interconnection layer 50 is formed on the upper layer electrode 46 with the inter-layer insulation film 12 therebetween. The upper layer electrode 46 and the intermediate interconnection layer 50 are electrically connected to each other through the via layer 48.

An upper interconnection layer 52 is formed on the intermediate interconnection layer 50 with the inter-layer insulation film 12 therebetween. The upper interconnection layer 52 is electrically connected to the lower layer electrode/lower interconnection layer 44 through a via layer 54, an intermediate interconnection layer 56 and a via layer 58. The intermediate interconnection layer 56 and the intermediate interconnection layer 50 are formed of the same layer.

As shown in FIG. 6A, the capacitor according to the present embodiment having the above-described structure is used as a capacitor 38 of a sample and hold circuit, as is in the first embodiment, That is, in the sample and hold circuit, the intermediate interconnection layer 50 of the capacitor is connected to a node 36, and the upper interconnection layer 52 electrically connected to the lower layer electrode/lower interconnection layer 44 is grounded with a potential constantly fixed.

The capacitor according to the present embodiment is characterized mainly by comprising an upper interconnection layer 52 which is disposed above the upper electrode 46 connected to the lower layer electrode/lower interconnection layer 44 and which sandwiches the upper layer electrode 46 of the MIM capacitor together with the lower layer electrode/lower interconnection layer 44. Such structure that the upper layer electrode 46 is sandwiched between the lower layer electrode/lower interconnection layer 44 and the upper interconnection layer 52 can depress generation of parasitic capacitance. The upper interconnection layer 52 functions as a shield to thereby shield the upper layer electrode 46 from the external noises.

Then, the method for fabricating the capacitor according to the present embodiment will be explained with reference to FIGS. 7A–7D, 8A–8C, and 9A–9C.

Figure 7A:
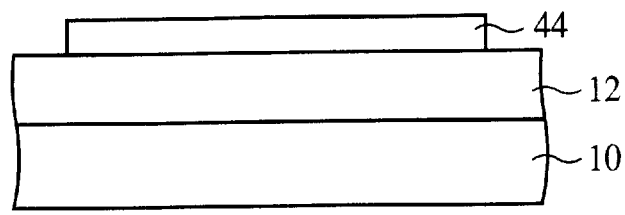
FIGS. 7A–7D are sectional views of the capacitor according to a third embodiment of the present invention in the steps of the method for fabricating the capacitor, which explain the method (Part 1).

First, the inter-layer insulation film 12 is formed on the substrate 10. Next, an aluminium film, for example, is formed on the inter-layer insulation film 12. Next, the aluminium film is patterned by the usual lithography technique into the lower layer electrode/lower interconnection layer 44, which functions as the lower layer electrode of the MIM capacitor and the interconnection (FIG. 7A)

Figure 7B:
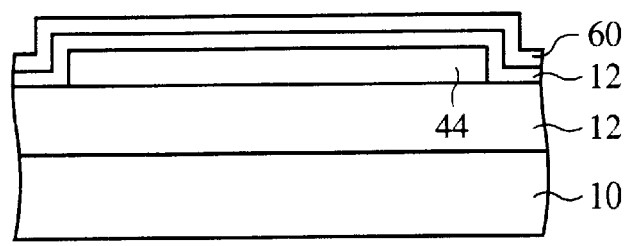

Next, the inter-layer insulation film 12 and a titanium nitride film 60 are formed on the entire surface in the stated order (FIG. 7B).

Figure 7C:
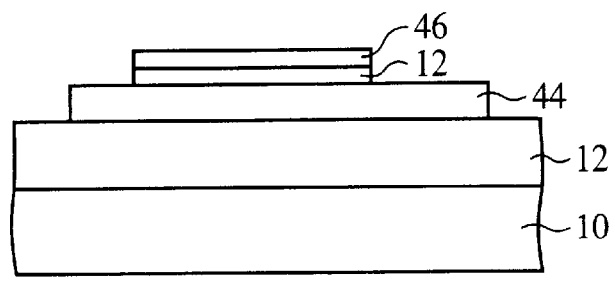

Then, the inter-layer insulation film 12 and the titanium nitride film 60 are patterned by the usual lithography technique to form the upper layer electrode 46 opposed to the lower layer electrode/lower interconnection layer 44 with the inter-layer insulation film 12 therebetween (FIG. 7C).

Figure 7D:
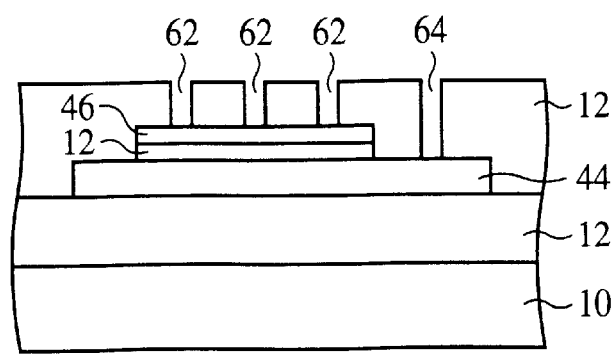

Next, the inter-layer insulation film 12 is formed on the entire surface, and via holes 62 and a via hole 64 are formed in the inter-layer insulation film 12 respectively down to the upper layer electrode 46 and down to the lower layer electrode/lower interconnection layer 44 (FIG. 7D).

Figure 8A:
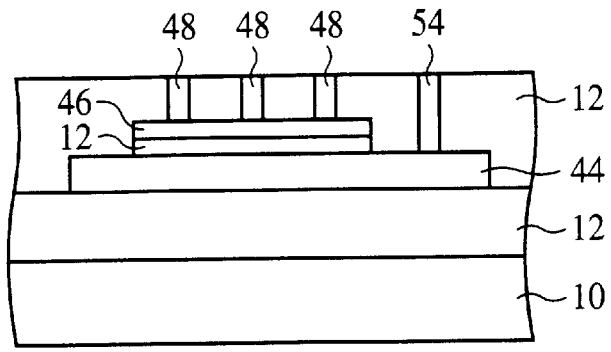
FIGS. 8A–8C are sectional views of the capacitor according to a third embodiment of the present invention in the steps of the method for fabricating the capacitor, which explain the method (Part 2).

Next, a metal film is formed on the entire surface to bury the metal film in the via holes 62, 44. The metal film except that buried in the via holes 62, 44 is removed by CMP. Thus, the via layer 48 electrically connected to the upper layer electrode 46, and the via layer 54 electrically connected to the lower layer electrode/lower interconnection layer 44 are formed (FIG. 8A).

Figure 8B:
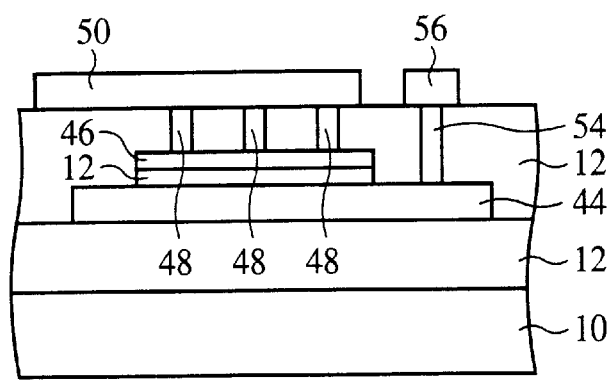

Next, an aluminium film, for example, is formed on the entire surface. Next. the aluminium film is patterned into the intermediate interconnection layers 50, 56 connected respectively to the via layers 48, 54 by the usual lithography technique (FIG. 8B).

Figure 8C:
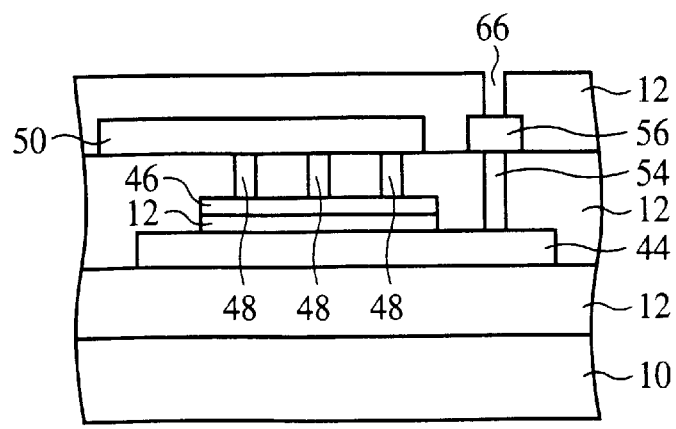

Then, the inter-layer insulation film 12 is formed on the entire surface, and a via hole 66 is formed in the inter-layer insulation film 12 down to the intermediate interconnection layer 56 down to the lower layer electrode/lower interconnection layer 44 (FIG. 8C).

Figure 9A:
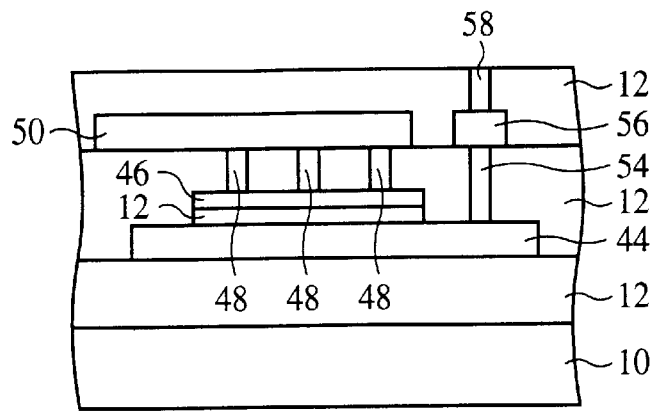
FIGS. 9A–9C are sectional views of the capacitor according to a third embodiment of the present invention in the steps of the method for fabricating the capacitor, which explain the method (Part 3).

Next, a metal film is formed on the entire surface to bury the metal film in the via hole 66. Then, the metal film except that buried in the via hole 66 is removed by CMP. Thus, the via layer 58 is formed, electrically connected to the intermediate interconnection layer 56 (FIG. 9A).

Figure 9B:
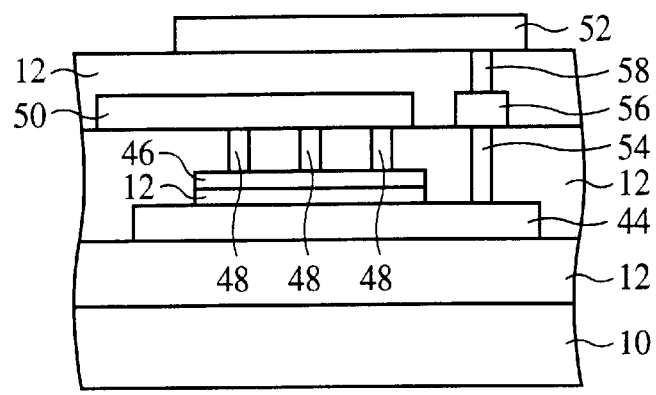

Then, an aluminium film, for example, is formed on the entire surface and is patterned into the upper interconnection layer 52 connected to the via layer 58 by the usual lithography technique (FIG. 9B).

Figure 9C:
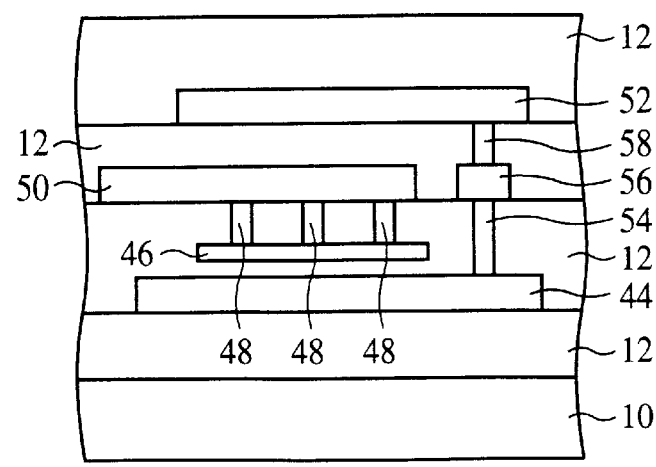

Next, the inter-layer insulation film 12 is formed on the entire surface, and the fabrication of the capacitor according to the present embodiment is completed (FIG. 9C).

As described above, according to the present embodiment, the upper layer electrode 46 of the MIM capacitor is covered by the lower layer electrode/lower interconnection layer 44 and the upper interconnection layer 52 electrically connected to the lower layer electrode/lower interconnection layer 44, whereby generation of the parasitic capacitance can be prevented, and external noises can be shielded off.

As the via layer 26c and the relay interconnection layer 20c are formed at a plurality of positions, surrounding the lower layer electrode 22 and the upper layer electrode 24 in the first embodiment, also in the present embodiment, the via layer connected to the lower layer electrode/lower interconnection layer 44, etc. may be formed at a plurality of positions, surrounding the upper layer electrode 46. Thus, external noises can be more effectively shielded off.

[A Fourth Embodiment]

Figure 10A:
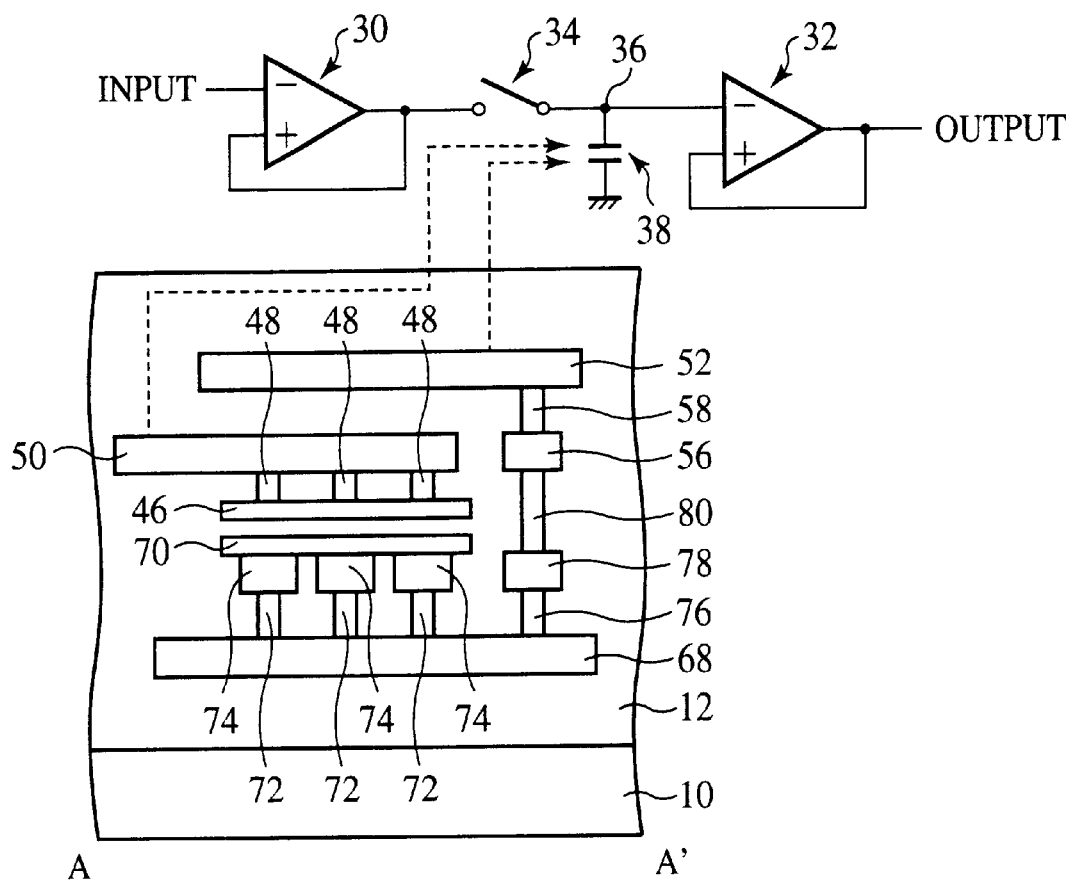
FIGS. 10A and 10B are diagrammatic views of the capacitor according t a fourth embodiment of the present invention, which show a structure thereof.
Figure 10B:
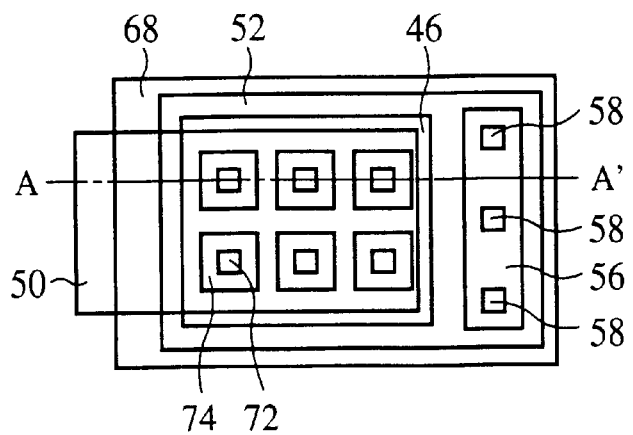

The capacitor according to a fourth embodiment of the present invention and the method for fabricating the capacitor will be explained with reference to FIGS. 10A, 10B, 11A–11D, and 12A–12C. FIGS. 10A and 10B are diagrammatic views of the capacitor according to the present embodiment, which show a structure thereof. FIGS. 11A–11D and 12A–12C are sectional views of the capacitor in the steps of the method for fabricating the capacitor, which show the method. The same members of the present embodiment as those of the capacitor according to the first to the third embodiments and the method for fabricating the capacitor are represented by the same reference numbers not to repeat or to simplify their explanation.

The capacitor according to the present embodiment will be explained with reference to FIGS. 10A and 10B. FIG. 10A is a sectional view of the capacitor according to the present embodiment, which shows the structure thereof. FIG. 10B is a top view of the capacitor according to the present embodiment, which shows the structure thereof. FIG. 10A shows an example of applying the capacitor according to the present embodiment to a sample and hold circuit. FIG. 10A is the sectional view along the line A–A' in FIG. 10B.

As shown in FIG. 10A, in the capacitor according to the present embodiment, a lower interconnection layer 68 is formed on a substrate 10 with an inter-layer insulation film 12. A lower layer electrode 70 of an MIM capacitor is formed on the lower interconnection layer 68 with the inter-layer insulation film 12 therebetween. The lower interconnection layer 68 and the lower layer electrode 70 are electrically connected to each other through a via layer 72 and a relay interconnection layer 74.

An upper layer electrode 46 of the MIM capacitor is formed on the lower layer electrode 70 with the inter-layer insulation film 12 therebetween. An intermediate interconnection layer 50 is formed on the upper layer electrode 46 with the inter-layer insulation film 12 therebetween. The upper layer electrode 46 and the intermediate interconnection layer 50 are electrically connected to each other through a via layer 48.

An upper interconnection layer 52 is formed on the intermediate interconnection layer 50 with the inter-layer insulation film 12 therebetween. The upper interconnection layer 52 is electrically connected to the lower interconnection layer 68 through a via layer 76, a relay interconnection layer 78, a via layer 80, an intermediate interconnection layer 56 and a via layer 58. The relay interconnection layer 78 and the relay interconnection layer 74 are formed of the same layer. The intermediate interconnection layer 56 and the intermediate interconnection layer 50 are formed of the same layer.

In the sample and hold circuit, as in the third embodiment, the intermediate interconnection layer 50 is connected to a node 36, and the upper interconnection layer 52 connected to the lower electrode 70 is ground with a potential fixed.

The capacitor according to the present embodiment is characterized mainly in that the upper interconnection layer 52 is disposed above the upper layer electrode 46, electrically connected to the lower interconnection layer 68 and sandwiches the upper layer electrode 46 of the MIM capacitor together with the lower interconnection layer 68. The structure that the lower interconnection layer 68 and the upper interconnection layer 52 sandwich the upper layer electrode 46 can depress generation of the parasitic capacitance. The upper interconnection layer 52 functions as a shield and can shield the upper layer electrode 46 from external noises.

Then, the method for fabricating the capacitor according to the present embodiment will be explained with reference to FIGS. 11A–11D and 12A–12C.

Figure 11A:
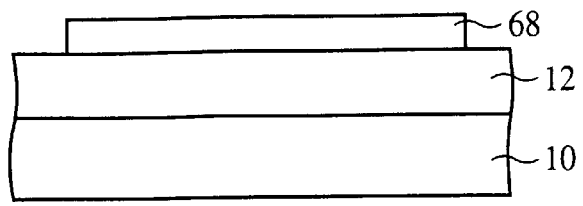
FIGS. 11A–11D are sectional views of the capacitor according to the fourth embodiment of the present invention in the steps of of the method for fabricating the same, which explain the method (Part 1).
Figure 11B:
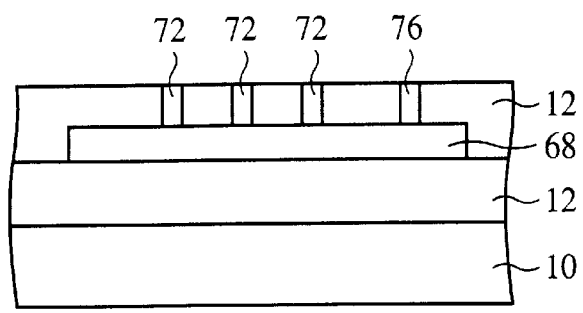

First, the inter-layer insulation film 12 is formed on the substrate 10. Then, an aluminium film, for example, is formed on the inter-layer insulation film 12. The aluminium film is patterned into the lower interconnection layer 68 by the usual lithography technique (FIG. 11A).

Next, the inter-layer insulation film 12 is formed on the entire surface, and via holes are formed in the inter-layer insulation film 12 down to the lower interconnection layer 68. Next, a metal film is formed on the entire surface to bury the metal film in the via holes. The metal film except that buried in the via holes is removed by CMP. Thus, the via layers 72, 76 are formed, electrically connected to the lower interconnection layer 68.

Figure 11C:
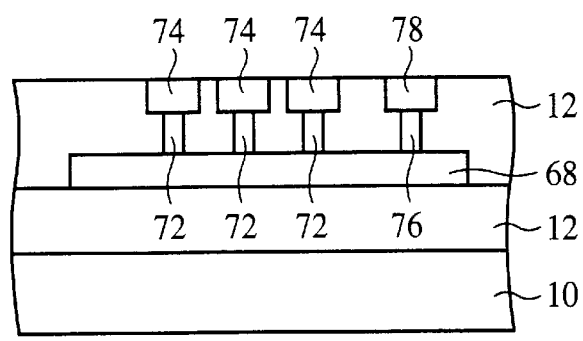

Next, the relay interconnection layers 74, 78 are formed by damascening used in copper interconnection process. That is, the inter-layer insulation film 12 is formed on the entire surface, and grooves are formed in the inter-layer insulation film 12 down to the via layers 72, 76. Then, a copper film, for example, is formed to bury the copper in the grooves. Next, the copper film except that buried in the grooves is removed by CMP. Thus, the relay interconnection layers 74, 78 are formed, electrically connected to the via layers 72, 76 (FIG. 11C).

Figure 11D:
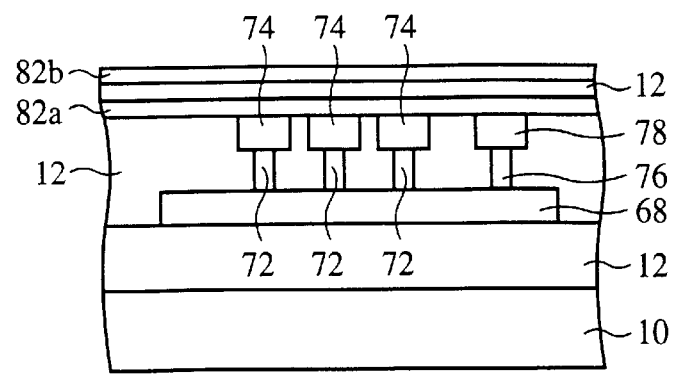

Then, a titanium nitride film 82a, the inter-layer insulation film 12 and a titanium nitride film 82b are formed on the entire surface in the stated order (FIG. 11D).

Figure 12A:
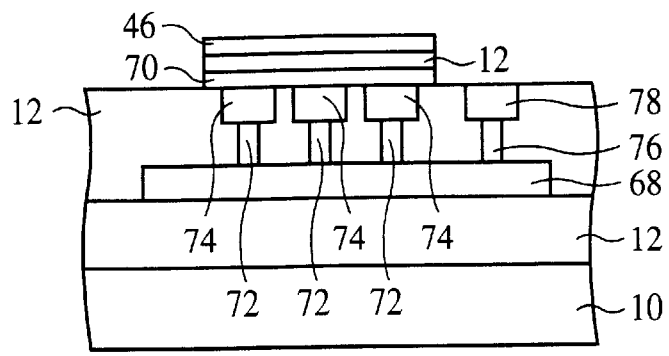
FIGS. 12A–12C are sectional views of the capacitor according to the fourth embodiment of the present invention in the steps of the method for fabricating the same, which explain the method (Part 2).

Next, the titanium nitride film 82a, the inter-layer insulation film 12 and the titanium nitride film 82b laid one on another is patterned by the usual lithography technique to form the lower layer electrode 70 connected to the relay interconnection layer 74 buried in the grooves, and the upper layer electrode 46 opposed to the lower layer electrode 70 with the inter-layer insulation film 12 therebetween (FIG. 12A).

Figure 12B:
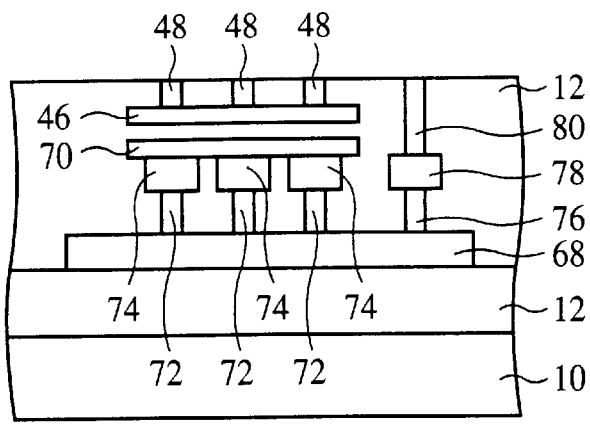

Then, the inter-layer insulation film 12 is formed on the entire surface, and via holes are formed in the inter-layer insulation film 12 respectively down to the upper layer electrode 46 and down to the relay interconnection layer 78. A metal film is formed on the entire surface to bury the metal film in the via holes. Next, the metal film except that buried in the via holes is removed by CMP. Thus, the via layer 48 electrically connected to the upper layer electrode 46, and the via layer 80 electrically connected to the relay interconnection layer 78 are formed (FIG. 12B).

Figure 12C:
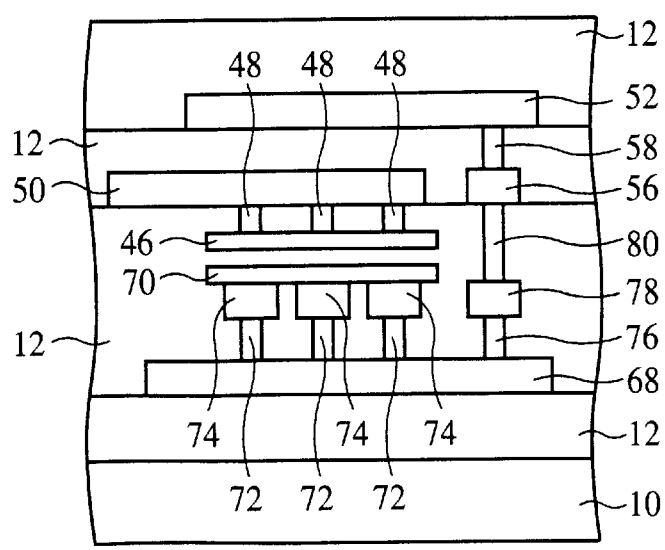
Figure 13A:
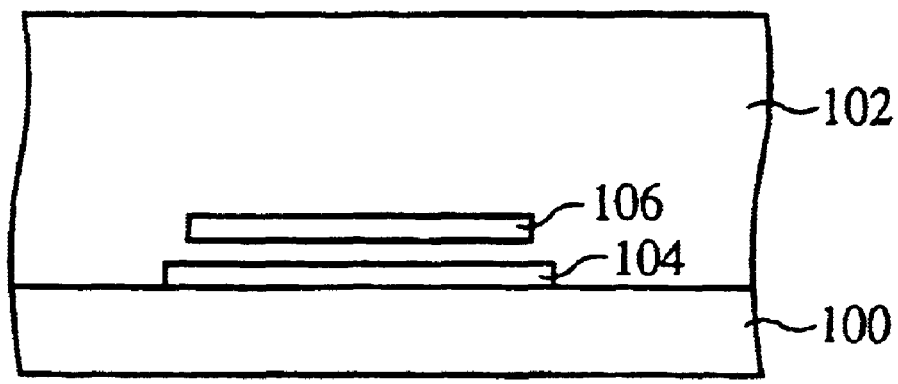
FIGS. 13A and 13B are diagrammatic views of the conventional capacitor, which show the structure thereof.
Figure 13B:
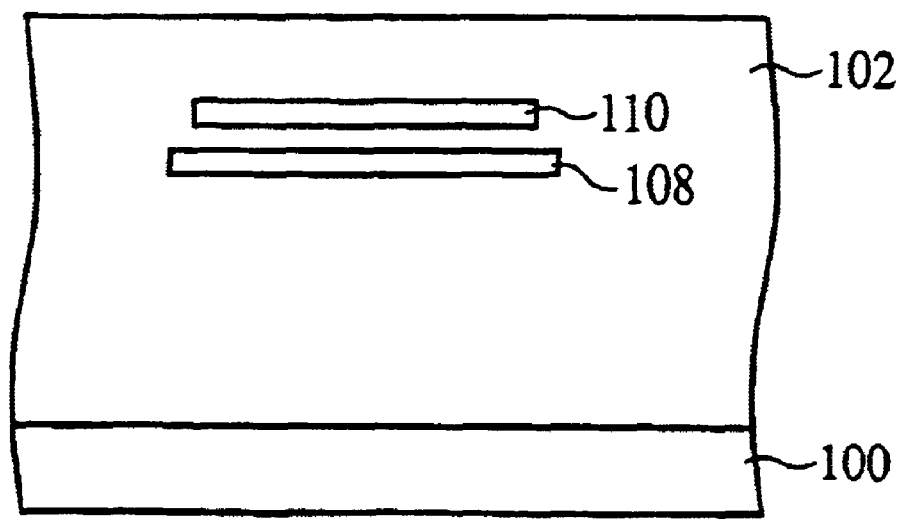
Figure 14A:
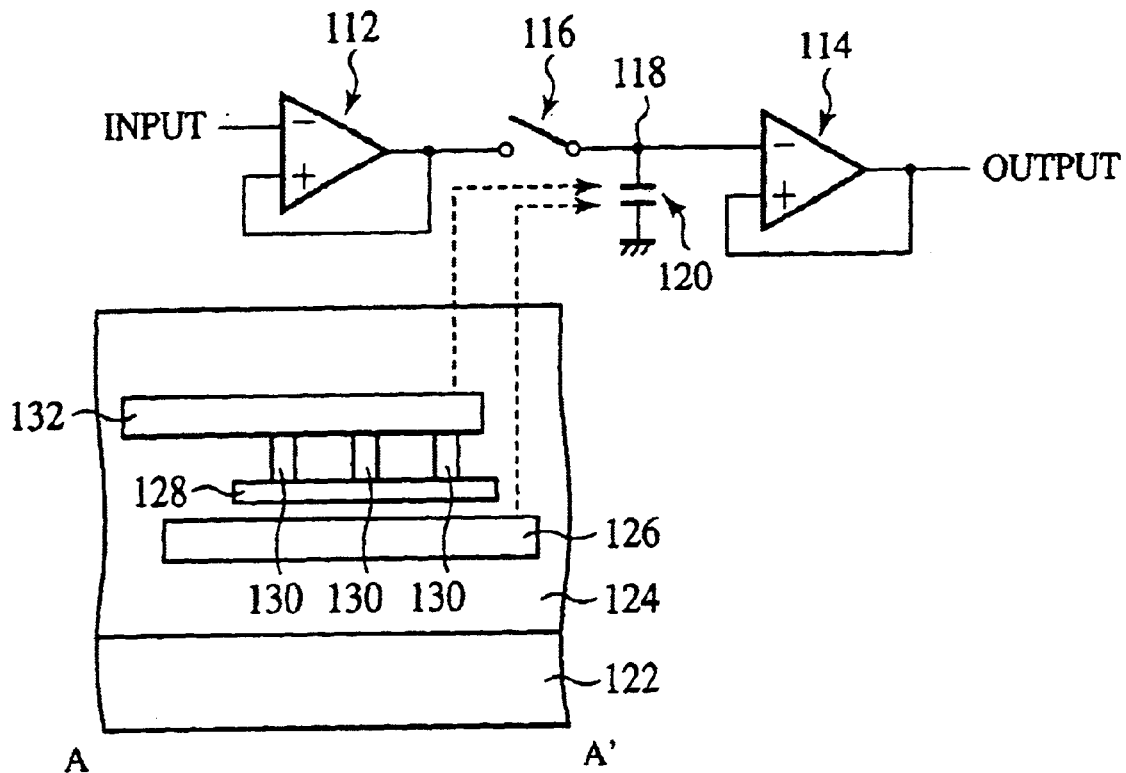
FIGS. 14A and 14B are diagrammatic views of the conventional capacitor applied to a sample-and hold-circuit.
Figure 14B:
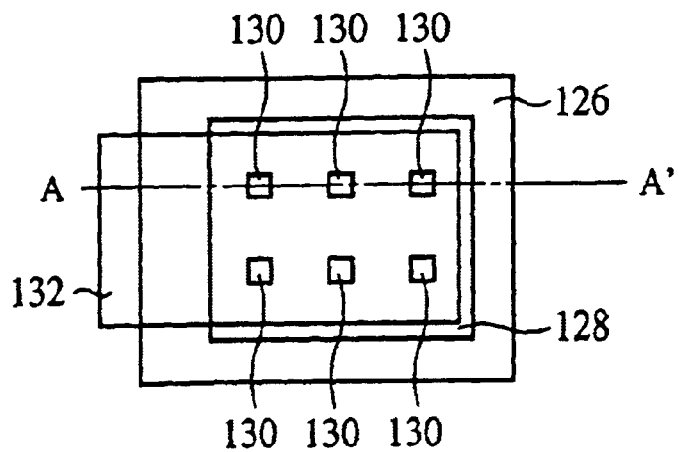

Next, in the same way as in the first embodiment, the intermediate interconnection layer 50 connected to the via layer 48, and the intermediate interconnection layer 56 connected to the via layer 80 are formed. Then, the inter-layer insulation film 12 is formed on the entire surface, and the upper interconnection layer 52 connected to the intermediate interconnection layer 56 through the via layer 58 is formed. Next, the inter-layer insulation film 12 is formed on the entire surface, and the method for fabricating the capacitor according to the present embodiment is completed (FIG. 12C).

As described above, according to the present embodiment, the upper layer electrode 46 of the MIM capacitor is covered with the lower interconnection layer 68 and the upper interconnection layer 52 electrically connected to the lower interconnection layer 68, whereby generation of the parasitic capacitance can be prevented, and external noises can be shielded off.

[Modifications]

The present invention is not limited to the above-described embodiments and can cover other various modification.

For example, in the above-described embodiment, the interconnection layers, such as the lower interconnection layer 14, the intermediate interconnection layers 16a, 16b, the upper interconnection layer 28, the lower layer electrode/lower interconnection layer 44, the intermediate interconnection layer 50, the upper interconnection layer 52, the intermediate interconnection layer 56, the lower interconnection layer 68, etc. are formed in aluminium interconnection layers by usual lithography technique. However, these interconnection layers may be formed in copper interconnection layers by damascening.

In the above-described embodiments, the capacitor according to the present invention is applied to sample and hold circuits but is not essentially applied to sample and hold circuits. In applications to other circuits it is preferable to decide the connections of the upper layer electrode and the lower layer electrode in consideration of a potential, etc. as in the application of the sample and hold circuits.

What is claimed is:

1. A capacitor comprising:

a lower layer electrode formed above a substrate with a first insulation film therebetween;

an upper layer electrode opposed to the lower layer electrode with a second insulation film therebetween; and a conductive lower interconnection layer formed between the substrate and the lower layer electrode and electrically connected to the upper layer electrode.

2. A capacitor according to claim 1, further comprising a conductive side interconnection layer electrically connected to the upper layer electrode and formed, covering the side of the lower layer electrode.

3. A capacitor according to claim 1, further comprising
a first interconnection pattern formed between the lower layer electrode and the conductive lower interconnection layer and electrically connected to the lower layer electrode; and
a second interconnection pattern opposed to the first interconnection pattern and connected to the conductive lower interconnection layer.

4. A capacitor according to claim 2, further comprising
a first interconnection pattern formed between the lower layer electrode and the conductive lower interconnection layer and electrically connected to the lower layer electrode; and
a second interconnection pattern opposed to the first interconnection pattern and connected to the conductive lower interconnection layer.

5. A capacitor according to claim 3, wherein,
the first interconnection layer pattern comprises conductive interconnection layers for interconnection capacitance formed in array; and
the second interconnection layer pattern comprises conductive interconnection layers for interconnection capacitance formed in array, opposed to each of the interconnection layers for interconnection capacitance of which the first interconnection layer pattern is comprised.

6. A capacitor according to claim 4, wherein,
the first interconnection layer pattern comprises interconnection layers for conductive interconnection capacitance formed in array; and
the second interconnection layer pattern comprises conductive interconnection layers for interconnection capacitance formed in array, opposed to each of the interconnection layers for interconnection capacitance of which the first interconnection layer pattern is comprised.

7. A capacitor comprising:
a lower layer electrode formed above a substrate with a first insulation film therebetween;
an upper layer electrode opposed to the lower layer electrode with a second insulation film therebetween;
a conductive lower interconnection layer formed between the substrate and the lower layer electrode and electrically connected to the upper layer electrode; and
an conductive upper interconnection layer formed above the upper layer electrode with a third insulation film therebetween and electrically connected to the conductive lower interconnection layer.

8. A capacitor according to claim 7, further comprising
a conductive side interconnection layer electrically connected to the lower layer electrode and formed, covering the side of the lower layer electrode.

* * * * *